(12) United States Patent
Fackelmeier et al.

(10) Patent No.: US 10,031,192 B2
(45) Date of Patent: Jul. 24, 2018

(54) ANTENNA APPARATUS FOR RECEIVING MAGNETIC RESONANCE SIGNALS

(71) Applicants: Andreas Fackelmeier, Thalmässing (DE); Sebastian Martius, Forchheim (DE); Markus Vester, Nürnberg (DE)

(72) Inventors: Andreas Fackelmeier, Thalmässing (DE); Sebastian Martius, Forchheim (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 1028 days.

(21) Appl. No.: 14/340,990

(22) Filed: Jul. 25, 2014

(65) Prior Publication Data

US 2015/0048823 A1 Feb. 19, 2015

(30) Foreign Application Priority Data

Aug. 19, 2013 (DE) .......................... 10 2013 216 376

(51) Int. Cl.

| G01R 33/561 | (2006.01) |
|---|---|
| G01R 33/34 | (2006.01) |
| G01R 33/341 | (2006.01) |
| G01R 33/36 | (2006.01) |
| G01R 33/3415 | (2006.01) |

(52) U.S. Cl.
CPC .......... *G01R 33/34* (2013.01); *G01R 33/341* (2013.01); *G01R 33/3642* (2013.01); *G01R 33/3685* (2013.01); *G01R 33/3415* (2013.01)

(58) Field of Classification Search
CPC .. G01R 33/34; G01R 33/341; G01R 33/3415; G01R 33/3642; G01R 33/3685
USPC ..................................... 324/322, 309
See application file for complete search history.

(56) References Cited

U.S. PATENT DOCUMENTS

| 2003/0050557 A1* | 3/2003 | Susil | ..................... A61B 5/055 |
|---|---|---|---|
| | | | 600/424 |
| 2012/0280872 A1* | 11/2012 | Werner | .............. H01Q 15/0053 |
| | | | 343/753 |

OTHER PUBLICATIONS

German Office Action cited in German Application No. 10 2013 216 376.2, dated Feb. 18, 2014, with English Translation.

* cited by examiner

*Primary Examiner* — Melissa Koval
*Assistant Examiner* — Courtney McDonnough
(74) *Attorney, Agent, or Firm* — Lempia Summerfield Katz LLC

(57) ABSTRACT

An antenna apparatus provides for receiving magnetic resonance signals from an examination object during magnetic resonance imaging using a magnetic resonance device. The antenna apparatus includes a resonator with a plurality of electrically conductive conductor loops, which are each interrupted by a number of electrically insulating slits. The antenna apparatus further includes a carrier substrate for holding the conductor loops and a cable connection apparatus having a number of shielding apparatuses. At least one of the number of shielding apparatuses provides a conductive coupling to a virtual ground of at least one conductor loop.

18 Claims, 4 Drawing Sheets

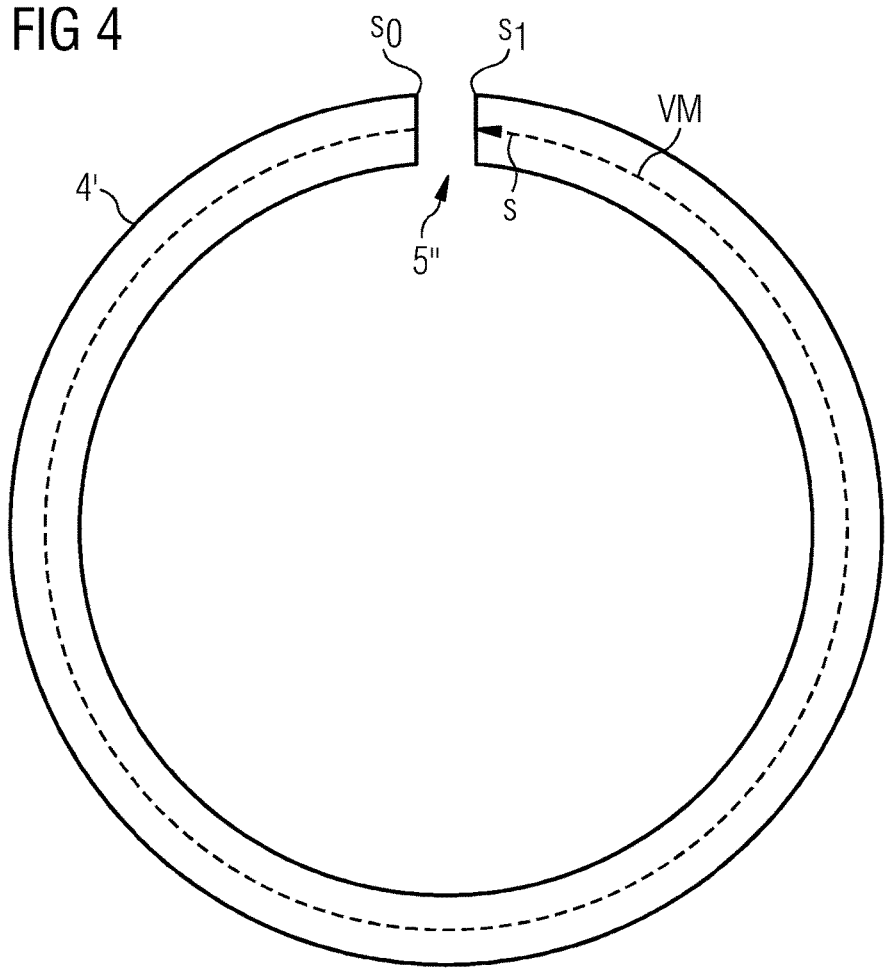
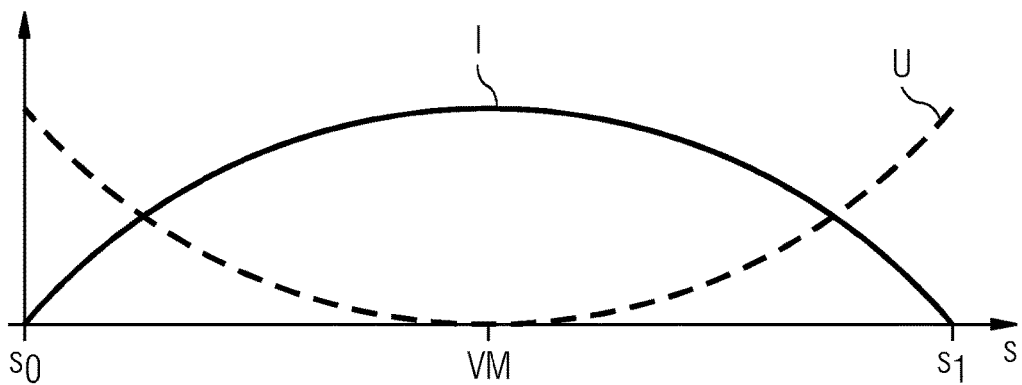

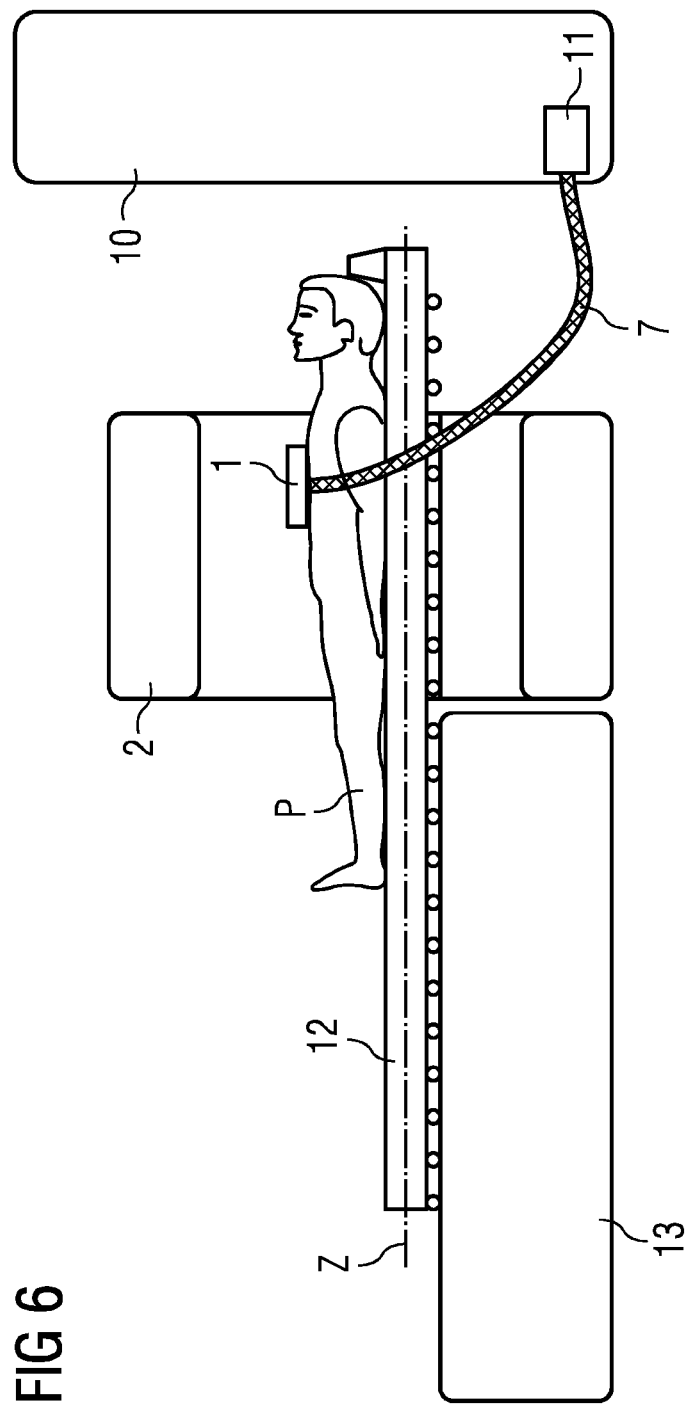

ANTENNA APPARATUS FOR RECEIVING MAGNETIC RESONANCE SIGNALS

This application claims the benefit of DE 10 2013 216 376.2, filed on Aug. 19, 2013, which is hereby incorporated by reference in its entirety.

FIELD

The present embodiments relate to an antenna and antenna array apparatus for receiving magnetic resonance signals from an examination object during magnetic resonance imaging using a magnetic resonance device.

BACKGROUND

These days, imaging systems from medical engineering play an important role in the examination of patients. The representations of the inner organs and structures of the patient generated by the imaging systems are used for diagnosing causes of disease, for planning operations, when carrying out operations or else for preparing therapeutic measures. Examples for such imaging systems include ultrasound systems, x-ray computed tomography (CT) systems, positron emission tomography (PET) systems, single photon emission computed tomography (SPECT) systems, or magnetic resonance (MR) systems.

In the case of the last-mentioned MR systems, so-called local coils are usually used within the scope of an MR examination for receiving MR signals from the examination object. These local coils are MR reception antenna assemblies containing MR antenna elements, usually in the form of conductor loops. During the examination, these local coils are arranged relatively close to the body surface, as directly as possible on the organ or body part of the patient to be examined. In contrast to relatively large antennas that are arranged further away from the patient and generally used to generate an overall slice image through a patient, local coils are arranged closer to the regions of interest. As a result, the noise portion caused by electrical losses within the body of the patient is reduced, leading to the signal-to-noise ratio of a local coil being, as a matter of principle, better than that from a more distant antenna.

The MR signals received by the MR antenna elements are generally still pre-amplified in the local coil, conducted out of the central region of the MR installation by cables and fed to a receiver of an MR system or an MR signal processing apparatus. In the latter, the received data are then digitized and processed further for imaging.

The MR antenna elements present in the local coil are generally coupled symmetrically by the cables. The cables are often embodied as coaxial cables. However, symmetrical coupling is not always possible and, as a result, so-called sheath waves are created on the connected coaxial cables. These sheath waves lead to falsification of the measurement data and thus adversely affect the quality of the MR imaging. Moreover, these sheath waves can also lead to relatively strong heating of the coaxial cables. The heating may, on occasion, cause burns to the skin in the case of direct skin contact of the patient with the cable.

Sheath wave chokes are used on the coaxial cables in order to avoid sheath waves. In the design of such a sheath wave choke, use is made either of a so-called balun, i.e. a lambda/4 resonator, or a parallel resonant circuit. Part of the coaxial cable is wound up for the parallel resonant circuit. This winding is bridged with a capacitor and tuned to the MR imaging frequency. However, a disadvantage arising here is that a very long coaxial cable has to be used. Due to low frequency of the MR imaging, the baluns, as a matter of principle, have very large dimensions. Accordingly, a patient may experience discomfort due to the additional narrowing of the examination space as a result of the sheath wave chokes or due to the additional weight lying on the patient as a result of the sheath wave chokes. This applies, in particular, if a plurality of local coils or antenna elements are used for receiving MR signals. Moreover, the examination space within an MR installation is restricted, restricting the use of a multiplicity of coaxial cables with sheath wave chokes. The restriction on space is a particular consideration if the patient is moved on an associated couch apparatus. Furthermore, the sheath wave chokes result in increased costs.

SUMMARY AND DETAILED DESCRIPTION

The scope of the present invention is defined solely by the appended claims and is not affected to any degree by the statements within this summary.

Accordingly, there is a desire for solutions for transmitting the MR signals to an MR system, which solutions avoid the sheath waves and the sheath wave chokes caused thereby.

It is an object to specify an improved antenna apparatus for receiving MR signals from an examination object during MR imaging with an MR device, an MR system for MR imaging and a method for receiving MR signals from an examination object during MR imaging using an MR device, all of which reduce or avoid sheath waves on the cable connections to an MR system and thus also enable MR imaging without sheath wave chokes.

An antenna apparatus according to one embodiment for receiving magnetic resonance signals from an examination object during magnetic resonance imaging using a magnetic resonance device includes a resonator. The resonator is a plurality of electrically conductive conductor loops, which are each interrupted by a number of electrically insulating slits.

Here and in the following text, "number" means a positive natural number greater than zero, whereas "a plurality of" represents a positive natural number greater than one here and in the following text. Here and in the following text, the term "examination object" or "patient" represents a human receiving medical treatment or an animal receiving medical treatment. Here, this also includes disease-free examination objects, i.e. also persons for whom image data are generated for preventative measures, e.g. within the scope of preventive screening for cancer prophylaxis. In the following text, the terms "examination object" and "patient" are used synonymously and without restricting the invention. Moreover, the invention does not distinguish between female and male patients.

Here, and in general, a "resonator" denotes a system that is able to vibrate, the components of which are tuned to a specific resonant frequency in such a way that the resonator vibrates when excited at this resonant frequency. The electrical resonator according to embodiments is excited by the electromagnetic MR signals during MR imaging, as a result of which a current is induced in the conductor loops. The properties of the resonator emerge, inter alia, from the self-capacitances and the self-inductances of the conductor loops and from the coupling capacitances and the coupling inductances between the conductor loops. This means that, inter alia, the geometric dimensions of the conductor loops and the spatial positions thereof with respect to one another fix the properties of the resonator. Moreover, there are advantageously improvements in the properties of the resonator as a result of the number of slits in the conductor loops, since the pair-by-pair delimitations of the electrically conductive conductor loops on an electrically insulating slit act like the plates of a capacitor, which is arranged in series with the inductance of the conductor loop. This capacitance leads to a resonant frequency that is lower than the resonant frequency of a non-slitted conductor loop. That is to say that the number of slits may specify a resonator whose resonant wavelength is longer than the dimensions of a conductor loop. This property in turn leads to a resonator with relatively low power losses (i.e. a high-quality resonator). A further improvement in the properties of the resonator results from the use of more than one conductor loop (e.g., from the coupling capacitances and inductances between the conductor loops).

Furthermore, the antenna apparatus according to one embodiment includes a carrier substrate for holding the conductor loops. The carrier substrate serves, firstly, as a mechanical support for the conductor loops in order to simplify handling of the conductor loops within medical practice and in order to avoid deformation of, or damage to, the conductor loops when the antenna apparatus is used. Moreover, the properties of the resonator are, inter alia, also determined by the carrier substrate.

Moreover, the antenna apparatus according to one embodiment includes a cable connection apparatus having a number of shielding apparatuses, wherein at least one of the number of shielding apparatuses has a conductive coupling to a virtual ground of at least one conductor loop.

Here, a point or region on a conductor loop that has ground potential is referred to as virtual ground or else virtual zero, even if currents induced by MR signals flow in the conductor loop and the virtual ground is not directly connected to a ground device. The cable connection apparatus serves for forwarding the MR signals received from the plurality of conductor loops to an image processing apparatus of an MR system. As a result of conductively coupling the shielding apparatus or shielding of the cable connection apparatus to the virtual ground of a conductor loop, sheath waves on the cable connection apparatus may advantageously be reduced or even completely eliminated. This reduces unwanted heating of the cable connection apparatus during the MR imaging. Furthermore, as a result of conductively coupling the shielding apparatus to the virtual ground of a conductor loop of the resonator, it is possible to reduce or avoid sheath wave chokes and the disadvantages during MR imaging accompanying the sheath wave chokes.

An antenna array apparatus according to one embodiment a plurality of antenna apparatuses.

A magnetic resonance system according to one embodiment for magnetic resonance imaging includes a magnetic resonance device and at least one antenna apparatus or at least one antenna array apparatus.

A method according to one embodiment for receiving magnetic resonance signals from an examination object during magnetic resonance imaging using a magnetic resonance device includes a method step for positioning an antenna apparatus on, or in the direct vicinity of, body parts of the examination object, the magnetic resonance signals of which are to be received. The antenna apparatus is characterized by a resonator including a plurality of electrically conductive conductor loops, which are each interrupted by a number of electrically insulating slits, a carrier substrate for holding the conductor loops, and a cable connection apparatus including a number of shielding apparatuses. At least one of the number of shielding apparatuses includes a conductive coupling to a virtual ground of at least one conductor loop. Furthermore, the method includes a method step for carrying out the magnetic resonance imaging using the magnetic resonance device and forwarding the magnetic resonance signals received by the antenna apparatus, via the cable connection apparatus, to an interface apparatus of a magnetic resonance system.

In a preferred configuration of the antenna apparatus, the conductor loops have a circular configuration and are arranged concentrically with respect to one another. As a result of such an arrangement, it is advantageously possible to modify the properties of the resonator since the concentric arrangement of the conductor loops with respect to one another leads to a high electromagnetic coupling effect between the conductor loops. Furthermore, relatively homogeneous electromagnetic fields may be obtained in the vicinity of the conductor loops as a result of the circular configuration of the conductor loops. As an alternative to a circular configuration, a conductor loop may be configured in approximately a polygonal form, for example as a rectangle or hexagon.

A configuration of the antenna apparatus particularly advantageous for MR imaging is characterized in that a conductor loop has 4 to 12 slits, preferably 8 slits.

The antenna apparatus may be configured in such a way that at least two of the plurality of conductor loops are arranged in a common spatial plane. By way of example, the conductor loops may be arranged together on one side of a planar carrier substrate.

A particularly preferred embodiment of the antenna apparatus is characterized in that the conductor loops are arranged in various spatial planes that are parallel to one another, preferably in such a way that the carrier substrate brings about an electrical insulation between the conductor loops. Here, the conductor loops may be arranged on the outer sides of the carrier substrate. It is likewise possible for the conductor loops, at least in part, to be formed by the carrier substrate. In particular, the conductor loops may be realized using methods as are known from manufacturing printed circuit boards (PCBs). The methods used there for producing multi-layer printed circuit boards may advantageously be used to implement antenna apparatuses with a plurality of conductor loops in various, mutually parallel spatial planes.

In a further preferred configuration of the antenna apparatus, the conductor loops are configured in such a way that the slits thereof are arranged spatially offset with respect to one another. An offset arrangement in which the offset substantially corresponds to an angle of rotation of 180° divided by the number of slits is advantageous, particularly in the case of a circular configuration of the conductor loops. That is to say that, in the case of conductor loops with, for example, two slits, particularly advantageous resonator properties may be achieved by an approximately 90° offset arrangement.

The conductive coupling to a conductor loop of the antenna apparatus according to one embodiment is preferably arranged in such a way that the conductive coupling has, to the greatest possible extent, a maximum spatial distance from the number of slits of the conductor loop. That is to say that, for example, in the case of a circular conductor loop, the conductive coupling to the conductor loop is substantially arranged offset from the adjacent slits by an angle of rotation of 180° divided by the number of slits. For a circular conductor loop with eight slits, this means that the conductive coupling is arranged offset by approximately 22.5° with respect to the two closest adjacent slits (i.e. centrally between the two slits). The desired connection to the virtual ground of the conductor loop is achieved by such an arrangement since the voltage minima of a resonator of the antenna apparatus generally occur at a maximum distance from the slits of the conductor loops.

In one configuration of the antenna apparatus, a conductor loop includes only one loop winding. In addition thereto, configurations with a plurality of windings or arrangements in which a conductor loop approximately reproduces a figure of eight or the shape of a four-leaved clover are also feasible.

The antenna apparatus is preferably configured in such a way that one or more of the conductor loops of the antenna apparatus have a planar configuration. A conductor loop may be considered to be planar if the width of the conductor loop is substantially larger than the thickness of the conductor loop, for example if the conductor loop has a width which is more than two-times larger than the thickness of the conductor loop. Such a configuration may improve the properties of the resonator since the accordingly assigned capacitances increase as a result of the planar embodiment. In particular, a configuration is preferred in which the plane of the main direction of extent of the conductor loops with planar embodiments is arranged parallel to the plane of the main direction of extent of a carrier substrate with a planar embodiment.

Furthermore, the antenna apparatus may preferably be characterized in that the dimensions and/or the number of slits are configured in such a way that a resonant frequency of the resonator approximately corresponds to a resonant frequency of the magnetic resonance device. Here, all three spatial dimensions of the slits (i.e., the width, length and height thereof) are included in the tuning of the resonant frequency. Moreover, there can be further tuning of the resonant frequency of the resonator to the resonant frequency of the magnetic resonance device by a suitable selection of the geometry of the conductor loops and the relative spatial position thereof with respect to one another. In the case of a magnetic resonance device with 3 Tesla, as is conventional in medical practice, the resonator of the antenna apparatus is preferably set to a resonant frequency of approximately 123.2 MHz by the mentioned parameters. In this case, the diameter of the circular conductor loops is preferably 10 cm to 30 cm, wherein the conductor loops are spaced apart by a carrier substrate with a relative permittivity $\varepsilon_r$ of approximately 2.5 and a thickness of approximately 0.8 mm.

Moreover, the antenna apparatus may include a tuning apparatus for modifying the resonant frequency of the resonator. Here, a tuning apparatus may be embodied as a capacitor or inductor, which is arranged either parallel to, or in series with, a conductor loop of the antenna apparatus. The tuning apparatus may also include a plurality of capacitors and/or inductors arranged parallel to, and/or in series with, a conductor loop. The tuning apparatus particularly preferably includes a capacitor that is arranged in series between the cable connection apparatus and a conductor loop.

In a further configuration, the antenna apparatus may include a cable connection apparatus, which includes a coaxial cable. An outer conductor of the coaxial cable, as shielding apparatus, is conductively coupled to the virtual ground of a conductor loop.

An antenna apparatus according to one embodiment may be characterized in that the antenna apparatus is configured in such a way that the antenna apparatus may be used as transmission apparatus during MR imaging.

Furthermore, the antenna apparatus may be configured in such a way that the carrier substrate includes an electrically insulating material with a relative permittivity $\varepsilon_r$ of approximately 2 to 4, preferably an AD250 or FR4 material. Here, the term "approximately" describes the material and manufacturing tolerances conventional in this specialist field, as are known to an expert in the art. Such materials may improve the properties of the resonator since specific self- and coupling-capacitances of the conductor loops may be brought about by a suitable permittivity. The thickness of the carrier substrate is preferably approximately 1 mm, particularly preferably approximately 0.8 mm. Moreover, the antenna apparatus may be characterized in that the conductor loops comprise a non-magnetic metal, preferably copper.

A preferred antenna array apparatus according to one embodiment is characterized in that the plurality of antenna apparatuses are spatially arranged approximately in the form of a matrix.

BRIEF DESCRIPTION OF THE DRAWINGS

FIG. 4 shows a schematic illustration of a cross section through a conductor loop of an antenna apparatus according to one embodiment, FIG. 5 shows the spatial profile of current and voltage signals in a conductor loop according to FIG. 4, and FIG. 6 shows a schematic illustration of a side view of an MR system according to one embodiment.

DETAILED DESCRIPTION OF THE PREFERRED EMBODIMENTS

Figure 1:
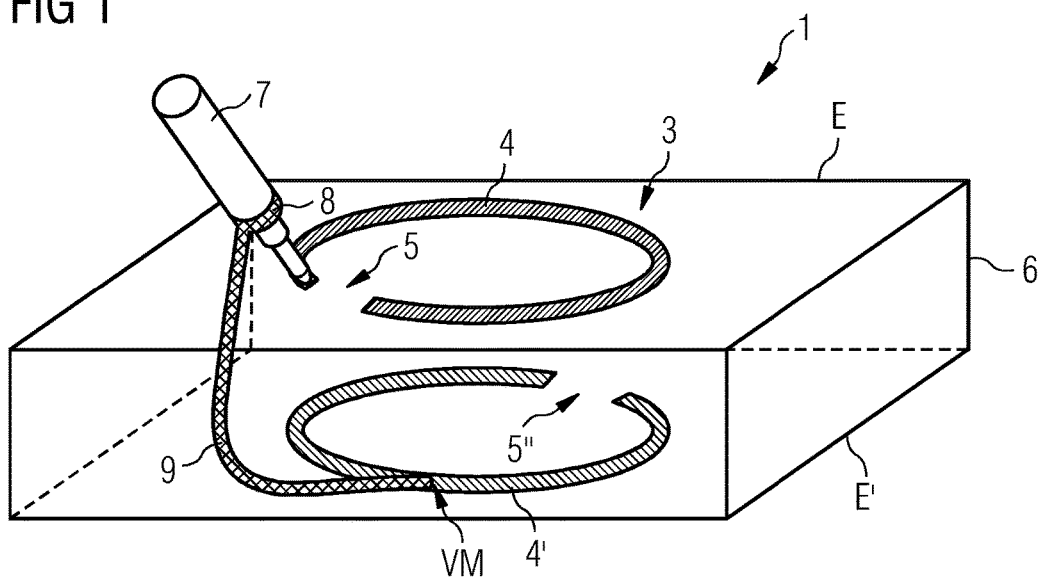
FIG. 1 shows a schematic illustration of a first exemplary embodiment of the antenna apparatus.

FIG. 1 shows a schematic illustration of a first exemplary embodiment of an antenna apparatus 1. The antenna apparatus 1 includes a resonator 3 with two circular conductor loops 4, 4', wherein each one of the conductor loops 4, 4' in each case has one slit 5, 5". The two conductor loops 4, 4' are arranged concentrically with respect to one another, wherein the two slits 5, 5" are offset with respect to one another by an angle of rotation of 180°/1=180°. The carrier substrate 6 holds the two conductor loops 4, 4' and establishes electrical insulation between these. Furthermore, as a result of the carrier substrate 6, the conductor loops 4, 4' are arranged in various spatial planes E, E' that are parallel to one another. Such arrangements of conductor loops 4, 4' are also found in a different technical specialist field which is not related to medical engineering, namely in the field of so-called meta-materials. Here, the conductor loop arrangements, then referred to as split-ring resonators (SRR), are dimensioned and configured in such a way that they impart negative permittivity on the materials produced thereby. The conductor loops 4, 4' in FIG. 1 are coupled by a cable connection apparatus 7, which is embodied as a coaxial cable. The shielding apparatus 8 of the cable connection apparatus 7 is electrically connected to the virtual ground VM of one of the two conductor loops 4' by a conductive coupling 9.

Figure 2:
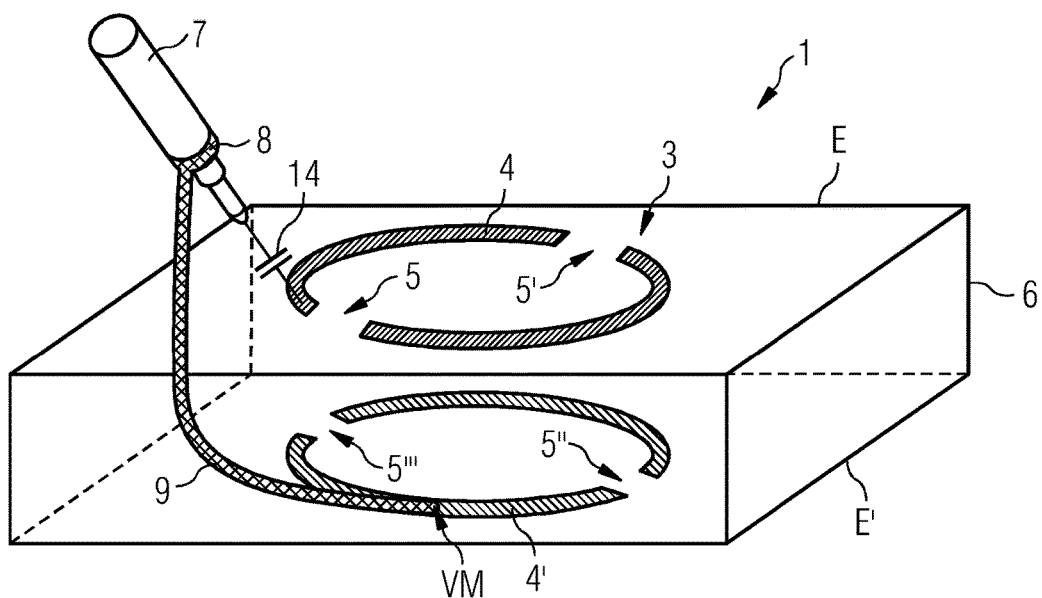
FIG. 2 shows a schematic illustration of a second exemplary embodiment of the antenna apparatus.

FIG. 2 shows a schematic illustration of a second exemplary embodiment of an antenna apparatus 1. In FIG. 2, the two conductor loops 4 and 4' respectively have two slits 5, 5' and 5", 5'" respectively. The slits 5, 5' in the upper conductor loop 4 are offset with respect to the slits 5", 5'" of the lower conductor loop 4' by an angle of rotation of approximately 180°/2=90°. The shielding apparatus 8 of the cable connection apparatus 7 is electrically conductively connected to the virtual ground VM of the lower conductor loop 4' by the conductive coupling 9. Here, the virtual ground VM is situated centrally between the two slits 5", 5'" or offset by an angle of rotation of 180°/2 with respect to the slits 5", 5'" of the conductor loop 4'. Furthermore, the embodiment in FIG. 2 exhibits a tuning apparatus 14 that, in this case, is arranged as a capacitor between the inner conductor of the cable connection apparatus 7 and the upper conductor loop 4. With the aid of this tuning apparatus 14, it is possible to vary the resonant frequency of the resonator 3 and adapt the resonant frequency to the frequencies of the magnetic resonance device 2. Here, the selected description of the conductor loops 4, 4' as "upper" and "lower" conductor loops 4, 4' does not set any preference in respect of the positioning of the antenna apparatus 1 on the examination object P. Both the upper conductor loop 4 and the lower conductor loop 4' may be arranged closer to the examination object P. Furthermore, it is not decisive whether the shielding apparatus 8 of the cable connection apparatus 7 is coupled to the virtual ground of the upper conductor loop 4 or to the virtual ground VM of the lower conductor loop 4'.

Figure 3:
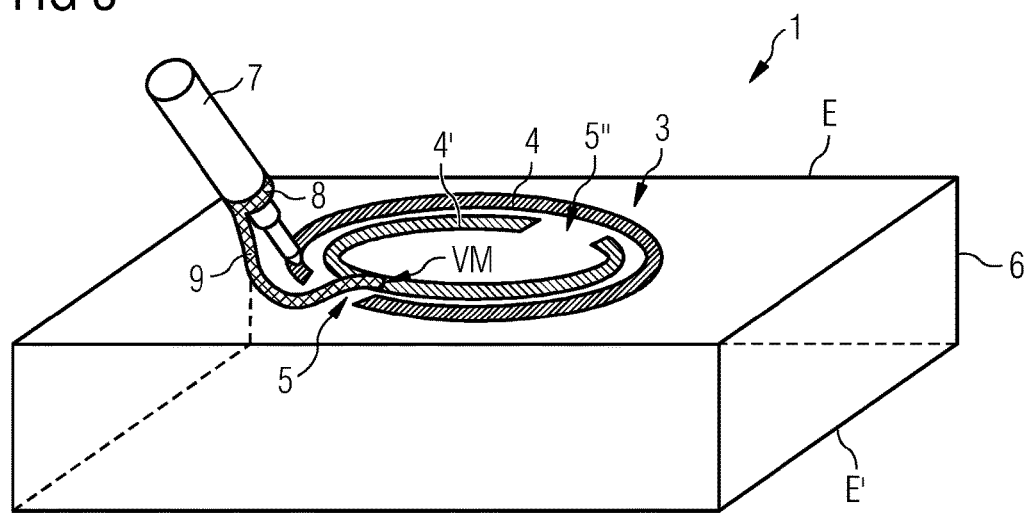
FIG. 3 shows a schematic illustration of a third exemplary embodiment of the antenna apparatus.

FIG. 3 illustrates a schematic illustration of a third exemplary embodiment of the antenna apparatus 1. Here, the two circular conductor loops 4, 4' are situated in a concentric arrangement in a common plane E of the carrier substrate 6. Such an arrangement is advantageous when the coupling capacitance between the two conductor loops 4, 4' should experience different dimensioning than in the embodiments in FIGS. 1 and 2.

FIG. 4 shows a schematic illustration of a cross section through a conductor loop 4' of an antenna apparatus 1. The conductor loop 4' includes a slit 5" and a virtual ground point VM, which in turn is situated offset by an angle of rotation of approximately 180°/1=180° with respect to the slit 5". The two points $s_0$ and $s_1$ denote the two delimitation points of the slit 5" of the conductor loop 4' with respect to an imaginary axis s along the conductor loop 4'.

With respect to the specifications in FIG. 4, FIG. 5 plots the spatial profile of the current signal I and the voltage signal U in a conductor loop 4', which emerge in the case of an excitation of the antenna apparatus 1 by MR signals during MR imaging. It can immediately be seen that the voltage U has a maximum at the points $s_0$ and $s_1$ (i.e., that the voltage U has the greatest voltage value at the slit 5"). Conversely, a minimum of the voltage U is found at the greatest possible distance from the slit 5", that is to say at the virtual ground VM. By contrast, the spatial profile of the current I along the imaginary spatial axis s has a maximum at, or in the vicinity of, the virtual ground VM, while the spatial profile tends to zero near the slit 5" at the points $s_0$ and $s_1$.

FIG. 6 depicts a schematic illustration of a side view of an MR system according to one embodiment. A patient P is situated on a patient couch 12 of a couch apparatus 13. The patient couch 12 may be moved along a longitudinal axis Z by suitable roller apparatuses in order to position the patient P in an examination space in the inner region of the MR device 2 for the MR imaging. An antenna apparatus 1 is arranged on the chest region of the patient P. The antenna apparatus 1 transmits the MR signals received thereby, via a cable connection apparatus 7, to an interface apparatus 11 of an image processing station 10.

Further components of an MR device 2 include, inter alia, control apparatuses for being able to actuate the main field magnet contained in the MR device 2 and the gradient coils accordingly. Moreover, an MR device 2 typically contains radiofrequency transmission apparatuses for generating and amplifying radiofrequency pulses, in order to emit these via an antenna arrangement. However, all these components and the functionalities thereof are known to a person skilled in the art of medical imaging and are therefore not depicted in FIG. 6 for reasons of clarity. Reference is also made here to the fact that the embodiments may be used not only in MR devices 2 which have a cylindrical patient tunnel, but also in differently constructed MR devices 2 (e.g., with a measurement space open on three sides). Moreover, an image processing station 10 may also be a component of an MR device 2.

Finally, reference is once again made to the fact that the antenna apparatuses described above in detail are merely exemplary embodiments which can be modified by a person skilled in the art in various ways without departing from the scope of the invention. In particular, an antenna apparatus according to the invention may, for example, have more than two conductor loops. For the sake of completeness, reference is also made to the fact that the use of the indefinite articles "a" or "an" does not preclude the possibility of the relevant features also being present a number of times. Likewise, the term "apparatus" does not preclude the possibility of these consisting of a plurality of components, which may optionally also be distributed in space. The same also applies to the MR device and the MR system, the components of which may likewise be arranged spatially separated from one another in different housings.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An antenna apparatus for receiving magnetic resonance signals from an examination object during magnetic resonance imaging using a magnetic resonance device, the antenna apparatus comprising:
    a resonator comprising a plurality of electrically conductive conductor loops each interrupted by a number of electrically insulating slits;
    a carrier substrate for holding the conductor loops; and
    a cable connection apparatus comprising a number of shielding apparatuses, wherein at least one of the number of shielding apparatuses comprises a conductive coupling to a virtual ground of at least one of the conductor loops, the virtual ground and corresponding conductive coupling of the at least one of the number of shielding apparatuses to the at least one of the conductor loops being closer to a center around the at least one of the conductor loops between the slits than to the slits of the at least one of the conductor loops.

2. The antenna apparatus as claimed in claim 1, wherein the conductor loops have a circular configuration and are arranged concentrically with respect to one another.

3. The antenna apparatus as claimed in claim 1, wherein the number of electrically insulating slits comprises 4 to 12 slits.

4. The antenna apparatus as claimed in claim 1, wherein the conductor loops are arranged in a common spatial plane.

5. The antenna apparatus as claimed in claim 1, wherein the conductor loops are arranged in various spatial planes that are parallel to one another.

6. The antenna apparatus as claimed in claim 1, wherein the conductor loops are configured in such a way that the slits thereof are arranged spatially offset with respect to one another.

7. The antenna apparatus as claimed in claim 1, wherein the conductive coupling is arranged on one of the conductor loops in such a way that the conductive coupling has a maximum spatial distance from the number of slits of the conductor loop.

8. The antenna apparatus as claimed in claim 1, wherein one of the conductor loops comprises only one winding.

9. The antenna apparatus as claimed in claim 1, wherein one of the conductor loops has a planar configuration.

10. The antenna apparatus as claimed in claim 1, wherein dimensions of and/or the number of the slits are configured in such a way that a resonant frequency of the resonator corresponds to a resonant frequency of the magnetic resonance device.

11. The antenna apparatus as claimed in claim 1, wherein the cable connection apparatus comprises a coaxial cable, wherein an outer conductor of the coaxial cable is conductively coupled to the virtual ground of a conductor loop.

12. The antenna apparatus as claimed in claim 1, wherein the antenna apparatus is configured as a transmission apparatus.

13. The antenna apparatus as claimed in claim 1, wherein the carrier substrate comprises an electrically insulating material with a relative permittivity of 2 to 4.

14. The antenna apparatus as claimed in claim 5 wherein the conductor loops are arranged in the various spatial planes in such a way that the carrier substrate brings about an electrical insulation of the conductor loops.

15. The antenna apparatus as claimed in claim 2, wherein the number of electrically insulating slits comprises 4 to 12 slits.

16. An antenna array apparatus comprising:
a plurality of antenna apparatuses, each of the antenna apparatuses comprising:
a resonator comprising a plurality of electrically conductive conductor loops each interrupted by a number of electrically insulating slits;
a carrier substrate for holding the conductor loops; and
a cable connection apparatus comprising a number of shielding apparatuses, wherein at least one of the number of shielding apparatuses comprises a conductive coupling to a virtual ground of at least one of the conductor loops, the virtual ground of the at least one of the conductor loops being spaced from the electrically insulating slits of the at least one of the conductor loops and being closer to halfway between the electrical insulating slits than the electrical insulating slits.

17. A magnetic resonance system for magnetic resonance imaging, the magnetic resonance system comprising:
a magnetic resonance device; and
at least one antenna apparatus comprising:
a resonator comprising a plurality of electrically conductive conductor loops each interrupted by a number of electrically insulating slits;
a carrier substrate for holding the conductor loops; and
a cable connection apparatus comprising a number of shielding apparatuses, wherein at least one of the number of shielding apparatuses comprises a conductive coupling to a virtual ground of at least one of the conductor loops, the conductive coupling to the virtual ground being to a location of the at least one of the conductor loops offset to be centrally between the electrically insulating slits.

18. A method for receiving magnetic resonance signals from an examination object during magnetic resonance imaging using a magnetic resonance device, the method comprising:
positioning an antenna apparatus on, or in a vicinity of, body parts of the examination object, wherein the antenna apparatus comprises a resonator with a plurality of electrically conductive conductor loops each interrupted by a number of electrically insulating slits, a carrier substrate for holding the conductor loops, and a cable connection apparatus comprising a number of shielding apparatuses, wherein at least one of the number of shielding apparatuses comprises a conductive coupling to a virtual ground of at least one conductor loop where the virtual ground is spaced from the electrically insulating slits to be by a voltage minima;
carrying out the magnetic resonance imaging using the magnetic resonance device; and
forwarding the magnetic resonance signals received by the antenna apparatus, via the cable connection apparatus, to an interface apparatus of the magnetic resonance system.

* * * * *